United States Patent
Luo et al.

(10) Patent No.: US 9,559,707 B2
(45) Date of Patent: Jan. 31, 2017

(54) PHASE LOCKED LOOP WITH SUB-HARMONIC LOCKING PREVENTION FUNCTIONALITY

(71) Applicant: Lattice Semiconductor Corporation, Portland, OR (US)

(72) Inventors: Kexin Luo, Shanghai (CN); Yan Rui, Shanghai (CN); Shaoyong Lu, Shanghai (CN); Rui Yin, Shanghai (CN); Yu Shen, Shanghai (CN)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 14/423,422

(22) PCT Filed: Oct. 23, 2014

(86) PCT No.: PCT/CN2014/089267
§ 371 (c)(1),
(2) Date: Feb. 23, 2015

(87) PCT Pub. No.: WO2016/061781
PCT Pub. Date: Apr. 28, 2016

(65) Prior Publication Data
US 2016/0254818 A1    Sep. 1, 2016

(51) Int. Cl.
*H03L 7/06* (2006.01)
*H03L 7/089* (2006.01)
(Continued)

(52) U.S. Cl.
CPC ............ *H03L 7/0891* (2013.01); *H03L 7/089* (2013.01); *H03L 7/093* (2013.01); *H03L 7/099* (2013.01); *H03L 7/18* (2013.01); *H03L 2207/14* (2013.01)

(58) Field of Classification Search
USPC ................................ 327/147–149, 156–158
See application file for complete search history.

(56) References Cited

U.S. PATENT DOCUMENTS 4,419,760 A * 12/1983 Bjornholt ............... H04L 7/033
327/156
5,317,202 A * 5/1994 Waizman ............... H03K 5/133
327/156
(Continued)

FOREIGN PATENT DOCUMENTS

CN       1162219 A       10/1997
CN       1269640 A       10/2000

OTHER PUBLICATIONS

Hedayati, H. et al., "A 1 MHz Bandwidth, 6 GHz 0.18 μm CMOS Type-I ΔΣ Fractional-N Synthesizer for WiMAX Applications," IEEE Journal of Solid-State Circuits, Dec. 2009, pp. 3244-3252, vol. 44, No. 12.

(Continued)

*Primary Examiner* — Adam Houston
(74) *Attorney, Agent, or Firm* — Fenwick & West LLP

(57) ABSTRACT

Embodiments relate to type-I PLLs that do not lock at a sub-harmonic frequency of a reference clock signal by controlling timing of charging or discharging of one or more capacitors in the PLLs. A phase frequency detector (PFD) of a type-I PLL can prevent sub-harmonic locking by generating a clear output signal to cause a sampling capacitor of PLL's loop filter to discharge only during a time period when the sampling capacitor is not being charged. For example, the PFD can include a gating element to control the time during which the clear output signal is generated. By ensuring that the sampling capacitor is not discharged during a time period while it is being charged, the PLL's voltage-controlled oscillator is controlled to oscillate at an intended frequency rather than at a sub-harmonic of the intended frequency.

16 Claims, 8 Drawing Sheets

(51) Int. Cl.
*H03L 7/093* (2006.01)
*H03L 7/099* (2006.01)
*H03L 7/18* (2006.01)

(56) References Cited

U.S. PATENT DOCUMENTS

| | | | | |
|---|---|---|---|---|
| 5,710,563 | A * | 1/1998 | Vu | H03M 1/0663 |
| | | | | 341/155 |
| 6,249,240 | B1 * | 6/2001 | Bellaouar | H03K 5/2481 |
| | | | | 341/155 |
| 7,019,571 | B2 * | 3/2006 | Lim | H03L 7/093 |
| | | | | 327/148 |
| 7,230,495 | B2 | 6/2007 | Lee et al. | |
| 8,125,258 | B2 * | 2/2012 | Ishizaki | H04L 27/0014 |
| | | | | 327/149 |
| 2002/0136342 | A1 * | 9/2002 | Lee | H03L 7/087 |
| | | | | 375/376 |
| 2011/0012652 | A1 * | 1/2011 | Lamanna | H03L 7/0893 |
| | | | | 327/156 |
| 2011/0043394 | A1 * | 2/2011 | Farabegoli | H03M 1/1076 |
| | | | | 341/120 |
| 2014/0333346 | A1 * | 11/2014 | Bae et al. | H03L 7/087 |
| | | | | 327/5 |
| 2015/0372682 | A1 * | 12/2015 | Alexeyev | H03L 7/085 |
| | | | | 327/156 |
| 2016/0173109 | A1 * | 6/2016 | Montoriol | H03L 7/1976 |
| | | | | 327/156 |
| 2016/0196230 | A1 * | 7/2016 | Pihet | G06F 13/4027 |
| | | | | 710/314 |

OTHER PUBLICATIONS

Shekhar, S. et al., "A 2.4-GHz Extended-Range Type-I ΣΔ Fractional-N. Synthesizer With 1.8-MHz Loop Bandwidth and −110-dBc/Hz Phase Noise," IEEE Transactions on Circuits and Systems—II: Express Briefs, Aug. 2011, pp. 472-476, vol. 58, No. 8.
PCT International Search Report and Written Opinion, PCT Application No. PCT/CN2014/089267, Jul. 23, 2015, 11 pages.

* cited by examiner

PHASE LOCKED LOOP WITH SUB-HARMONIC LOCKING PREVENTION FUNCTIONALITY

BACKGROUND

Field of the Disclosure

This disclosure pertains in general to phase locked loops (PLLs) and more particularly to a sample and reset type-I PLL.

Description of the Related Art

PLLs are widely employed in radio, telecommunications, computers, and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors. Since a single integrated circuit can provide a complete PLL functionality, PLLs are widely used in modern electronic devices, with output frequencies ranging from a few hertz up to many gigahertz.

PLLs can be implemented as either a type-I PLL or a type-II PLL. Type-II PLL typically uses a large capacitor for improving stability of the loop, which increases the die cost and also causes leakage current issues as the technology scales down to deep sub-micron CMOS process technologies. A type-I PLL can reduce leakage current issues by implementing a linear phase detection and also by eliminating the large capacitor for stability. A drawback of conventional type-I PLLs is sub-harmonic locking, where the type-I PLL locks the loop to a frequency of the divider clock signal that is a sub-harmonic value of a frequency of an oscillator output signal of a voltage-controlled oscillator (VCO). Conventional type-I PLLs use a separate frequency detector loop that prevents the PLL from sub-harmonic locking by ensuring that the VCO oscillates at the proper frequency.

SUMMARY

Embodiments relate to a PLL where sub-harmonic locking is prevented. The PLL can include a mechanism for generating a charge output signal that operates to prevent locking of the PLL at a sub-harmonic of a frequency of an oscillator output signal by controlling timing during which one or more capacitors in the PLL is charged or discharged.

In one embodiment, the PLL can further include a loop filter that includes a sampling capacitor and a holding capacitor coupled in parallel via a switching element. The loop filter can generate a filter output signal based at least on the charge output signal indicating a first time period during which the sampling capacitor is charged. The PLL can also include a voltage controlled oscillator (VCO) coupled to the loop filter and can generate an oscillator output signal with a frequency corresponding to the filter output signal. The PLL can further include a divider coupled to the VCO to receive the oscillator output signal. The divider can perform frequency division on the oscillator output signal to generate a divider clock signal having a same phase as the oscillator output signal but a different frequency than the oscillator output signal. The PLL can also include a phase frequency detector (PFD) coupled to the divider to receive the divider clock signal. The PFD can generate the charge output signal based on a phase difference between the divider clock signal and the reference clock signal.

In one embodiment, the PFD can include a gating element to generate a clear output signal causing the sampling capacitor to discharge charge to a low reference voltage of the loop filter during a second time period different from the first time period.

In one embodiment, the gating element can include a digital gate performing a logical AND operation.

In one embodiment, a sum of the first time period and the second time period is equal to one half period of the reference clock signal.

In one embodiment, the second time period is defined as a period during which a charge is not transferred between the sampling capacitor and the holding capacitor via the switching element. During the second time period, each of the divider clock signal and the reference clock signal is inactive.

In one embodiment, the PFD can further generate a transfer output signal causing a transfer of charge between the sampling capacitor and the holding capacitor during a third time period different from the second time period.

In one embodiment, the third time period is defined by a pulse width of the transfer output signal. The pulse width of the transfer output signal increases as the phase difference increases and the pulse width of the transfer signal decreases as the phase difference decreases.

In one embodiment, a sum of the first time period, the second time period, and the third time period is less than a period of the reference clock signal.

In one embodiment, a sum of the second time period and the third time period is equal to one half period of the reference clock signal.

In one embodiment, the first time period is defined by a pulse width of the charge output signal. The pulse width of the charge output signal increases as the phase difference increases and the pulse width of the charge signal decreases as the phase difference decreases.

Embodiments also relate to operating a PLL to generate a charge output signal to charge a sampling capacitor during a first time period set to prevent locking of the PLL at a frequency that is a sub-harmonic of a frequency of an oscillator output signal.

In one embodiment, a filter output signal can be generated based at least on a charge output signal by a loop filter and an oscillator output signal with a frequency corresponding to the filter output signal can be generated by a voltage controlled oscillator. A divider clock signal can be generated by performing a frequency division on the oscillator output signal at a divider. The divider clock signal has the same phase as the oscillator output signal but has a frequency different than the oscillator output signal.

Embodiments also relate to a non-transitory computer-readable medium storing a digital representation of the PLL that can prevent sub-harmonic locking by controlling timing during which one or more capacitors in the PLL is charged or discharged.

DETAILED DESCRIPTION

Figure 1:
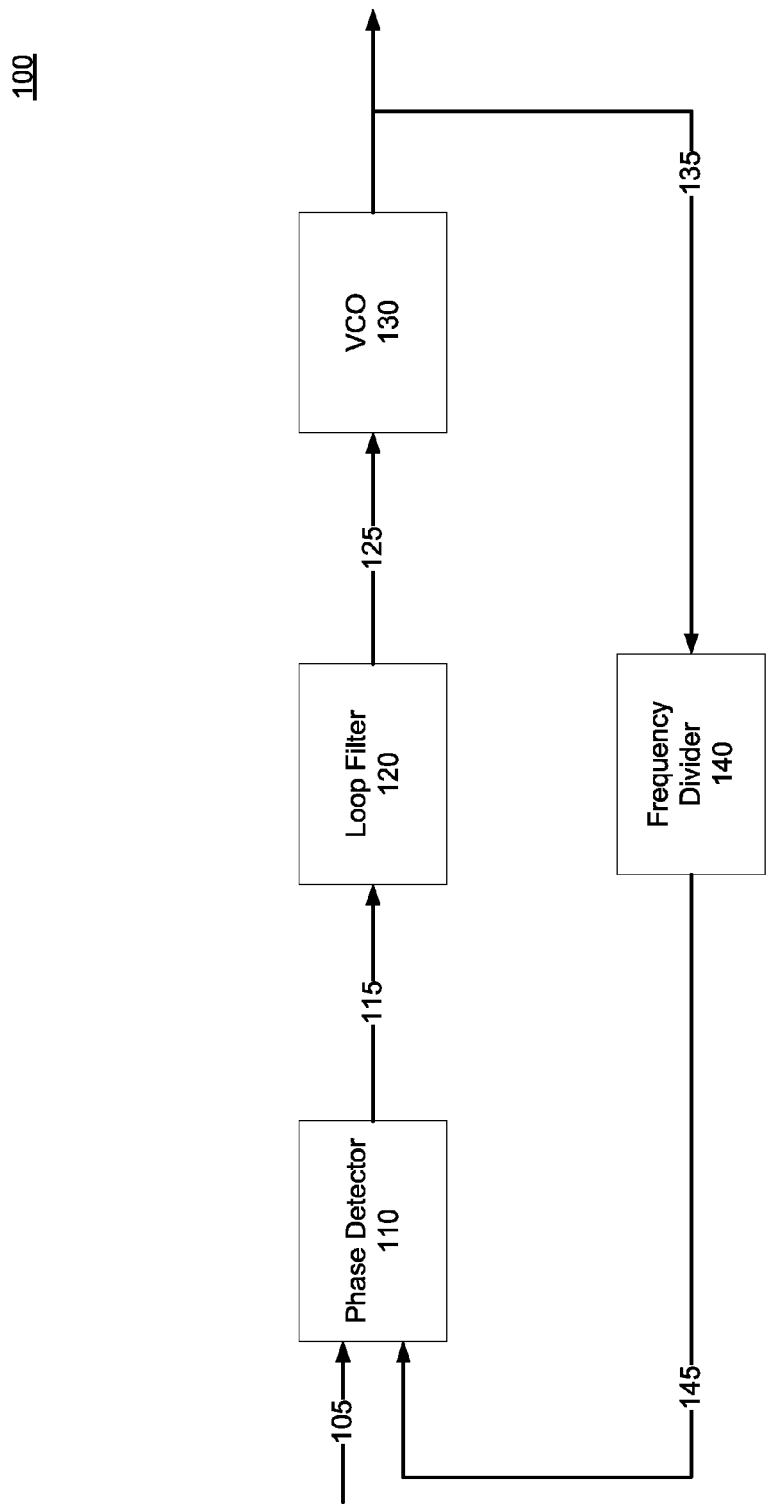
FIG. 1 is a high-level block diagram of a Phase-Locked Loop (PLL), according to one embodiment.

The Figures (FIGS.) and the following description relate to various embodiments by way of illustration only. It should be noted that from the following discussion, alternative embodiments of the structures and methods disclosed herein will be readily recognized as viable alternatives that may be employed without departing from the principles discussed herein. Reference will now be made in detail to several embodiments, examples of which are illustrated in the accompanying figures. It is noted that wherever practicable similar or like reference numbers may be used in the figures and may indicate similar or like functionality.

Embodiments of the present disclosure relate to type-I phase locked loops (PLLs) that do not lock at a sub-harmonic frequency of an oscillator output signal by controlling timing of charging or discharging of one or more capacitors in the PLLs. A phase frequency detector (PFD) of a type-I PLL can prevent sub-harmonic locking of the PLL by generating a clear output signal to cause a sampling capacitor of PLL's loop filter to discharge only during a time period when the sampling capacitor is not being charged. For example, the PFD can include a gating element to control the time during which the clear output signal is generated. By ensuring that the sampling capacitor is not discharged during a time period while it is being charged, the output of the loop filter is maintained at a level that causes PLL's voltage-controlled oscillator (VCO) to oscillate at an intended frequency rather than at a sub-harmonic of the intended frequency.

The term "active voltage level" described herein refers to a voltage level corresponding to a logical high level. For example, in a digital circuit with supply voltage VDD and ground voltage GND, an active voltage level is VDD or within a noise margin of VDD.

The term "inactive voltage level" described herein refers to a voltage level that corresponds to a logical low level. For example, an inactive voltage level is GND or within a noise margin of GND.

In a normal mode of operation, a PLL phase locks at an intended fundamental frequency of an oscillator output signal of the PLL's VCO. Due to non-idealities of the PLL, the PLL can undesirably phase lock at a sub-harmonic frequency of the oscillator output signal. For example, the VCO can generate an oscillator output signal at a frequency corresponding to a sub-harmonic of the intended fundamental frequency of oscillator output signal due to non-idealities of the PLL, which may cause the PLL to phase lock to the sub-harmonic frequency of the intended VCO output signal.

One technique to prevent the PLL from sub-harmonic locking is to use a frequency detector loop that assists the PLL to lock to an intended frequency that is a fundamental frequency of the VCO output signal. The frequency detector loop includes some components of the PLL and also includes some other components that are not part of the PLL. The components of the PLL included in the frequency detector loop can include loop filter, VCO, and frequency divider. The components that are not part of the PLL can include a frequency detector, a second charge pump that is separate from the PLL's charge pump, and control logic. While operating the frequency detector loop, the PLL is placed in an open loop configuration by disabling its phase detector. Instead of using the PLL's phase detector, the frequency detector loop uses the frequency detector, whose output signal is feed into the second charge pump. The frequency detector loop is further operated by feeding the second charge pump's output into the PLL's loop filter, and subsequently to the VCO, and the frequency divider. The frequency detector loop is completed when a divider clock signal (i.e., output of the frequency divider) and the reference clock signal are fed into the frequency detector. By comparing frequencies of the reference clock signal and the divider clock signals, the frequency detector loop can ensure that the VCO is oscillating at the desired frequency. After the frequency locking process is completed, the PLL is switched back to the closed loop configuration to perform phase locking, while the frequency detector loop is disabled.

Other techniques to prevent the PLL from sub-harmonic locking are described below with reference to FIGS. 2 through 5.

FIG. 1 is a high-level block diagram of a PLL, according to one embodiment. PLL 100 receives a reference clock signal 105 as an input and generates an output clock signal 135 that has the same phase as reference clock signal 105. For this purpose, PLL 100 includes, among other components, phase detector 110, loop filter 120, VCO 130, and frequency divider 140.

Phase detector 110 compares a phase of reference clock signal 105 and a frequency divided version (i.e., clock signal 145) of output clock signal 135. Phase detector 110 determines a phase difference between reference clock signal 105 and divider clock signal 145, and generates phase error signal 115. A type-I PLL typically uses a unipolar phase detector that generates phase error signal 115 only during a condition when reference clock signal 105 either leads or lags divider clock signal 155 but not for both conditions. In one embodiment, the unipolar phase detector generates phase error signal 115 only when reference clock signal 105 leads divider clock signal 145. Alternatively, the unipolar phase detector generates phase error signal 115 only when reference clock signal 105 lags divider clock signal 145. In some embodiments, phase detector can also implement a frequency detection feature whereby the phase detector becomes a phase/frequency detector (PFD).

Phase error signal 115 is input to a loop filter 120. In one embodiment, loop filter 120 is a low pass filter that filters out the high frequency components of the phase error signal and generates a control voltage signal 125 that is fed to VCO 130. The cutoff frequency of loop filter 120 determines the stability of the PLL. The characteristics of loop filter 120 determine how the PLL responds to non-ideal variations such as jitter in the reference clock signal 105. For example, if reference clock signal 105 includes jitter, it may be advantageous to design loop filter 120 so that the jitter is not propagated to the output of the PLL.

Typically, a loop filter of a PLL has a cutoff frequency that is smaller than one tenth of the frequency of reference clock signal 105. The cutoff frequency of loop filter 120 is controlled by a capacitance value of a capacitor used in loop filter 120. Capacitors with large capacitance values occupy a large area in PLLs and, as such, may increase the cost of manufacturing the integrated circuits (ICs) that include PLLs. For example, a capacitor may occupy 90% of the area of a loop filter, and the loop filter may occupy around 50% of the area of a PLL. In one embodiment, loop filter 120 includes a charge pump functionality. A PLL charge pump can be a CMOS or bipolar switched current source that outputs positive and negative current pulses into loop filter 120. A type-I PLL typically uses a unipolar charge pump that outputs either a positive or negative current pulse into loop filter 120. An exemplary loop filter is described below in detail with reference to FIG. 2.

VCO 130 receives control voltage signal 125 from loop filter 120 and generates a periodic output signal based on a voltage level of control voltage signal 125. Frequency divider 140 receives output clock signal 135 from VCO 130 and generates divider clock signal 145 that is fed into phase detector 110. Frequency divider 140 performs frequency division on output clock signal 135 to generate divider clock signal 145 that has the same phase as output clock 135 but has a frequency different than output clock signal 135. In some embodiments, frequency divider 140 may divide the frequency of output clock signal 135 by an integer. For instance, frequency divider 140 may generate one period of divider clock signal 145 for every N cycles of output clock signal 135. That is, the frequency of output clock signal 135 is divided by N. Alternatively, the frequency of output clock signal 135 can be divided by a fraction of an integer to implement a Frac-N divider and a Frac-N PLL.

Figure 2:
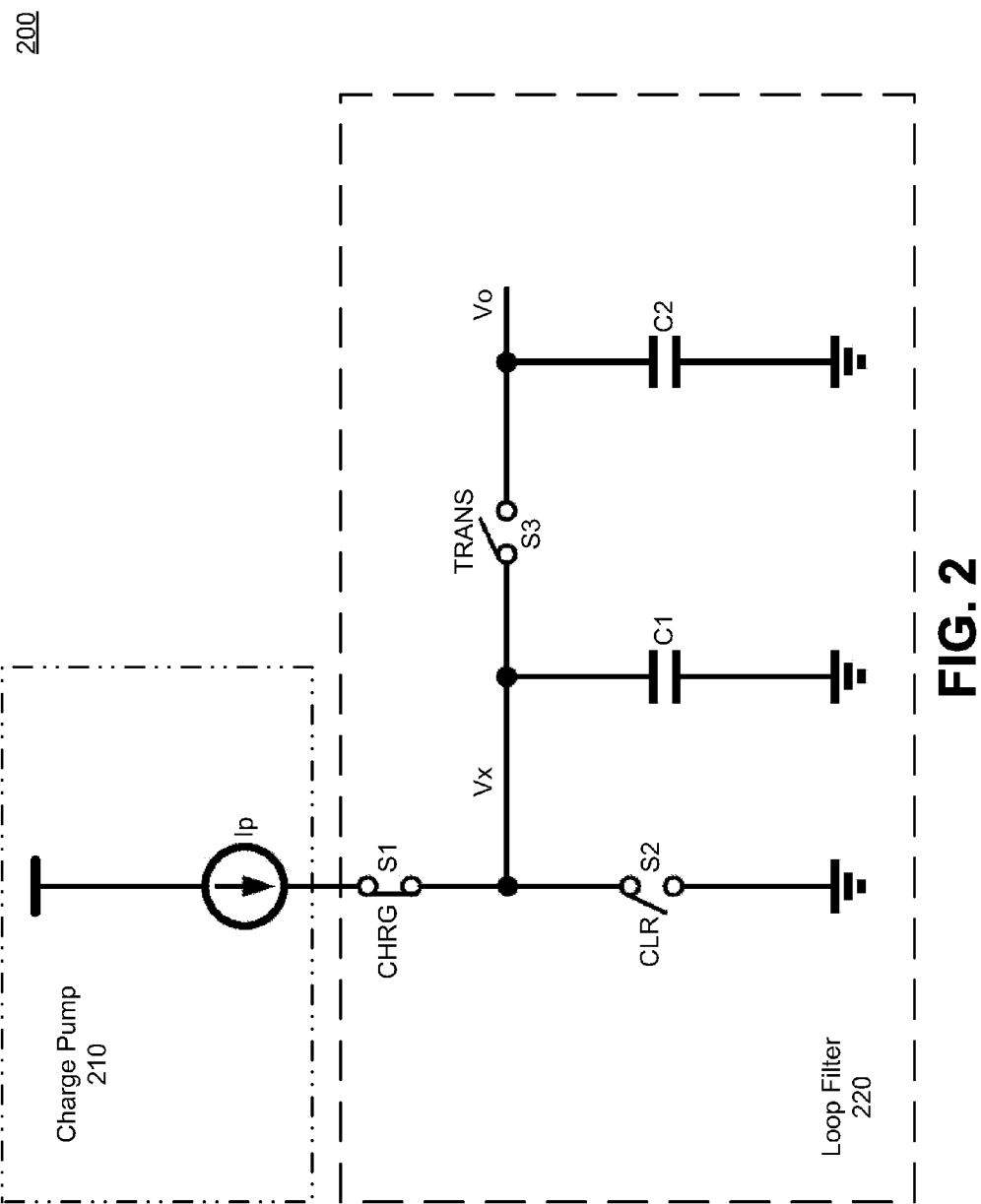
FIG. 2 is a block diagram of a charge pump and a sample-reset loop filter of a type-I PLL, according to one embodiment.

FIG. 2 is a block diagram of a charge pump and a sample-reset loop filter of a type-I PLL, according to one embodiment. Charge pump 210 includes a constant current source Ip that functions as a source for current into switched-capacitor based sample-hold-reset (SHR) loop filter 220 (hereinafter "SHR loop filter"). SHR loop filter 220 includes, among other components, switches S1 through S3, sampling capacitor C1, and holding capacitor C2. Switch S1 is controlled by a signal CHRG to charge sampling capacitor C1. The voltage level corresponding to a charge of sampling capacitor C1 is represented by Vx. CHRG signal is generated by phase detector 110 such that a pulse width of CHRG signal increases as a phase difference between reference clock signal 105 and divider clock signal 145 increases. Additionally, the pulse width of CHRG signal decreases as the phase difference decreases.

Switch S3 is controlled by a signal TRANS to transfer a charge between sampling capacitor C1 and holding capacitor C2. The voltage level corresponding to a charge of holding capacitor C2 is represented by Vo. TRANS signal is generated by phase detector 110 such that a pulse width of TRANS signal increases as a phase difference between reference clock signal 105 and divider clock signal 145 increases. Additionally, the pulse width of TRANS signal decreases as the phase difference decreases. Switch S2 is controlled by a signal CLR that is also generated by phase detector 110 to discharge (or reset) a charge of sampling capacitor C1 to a low reference voltage of SHR loop filter 220.

Figure 3:
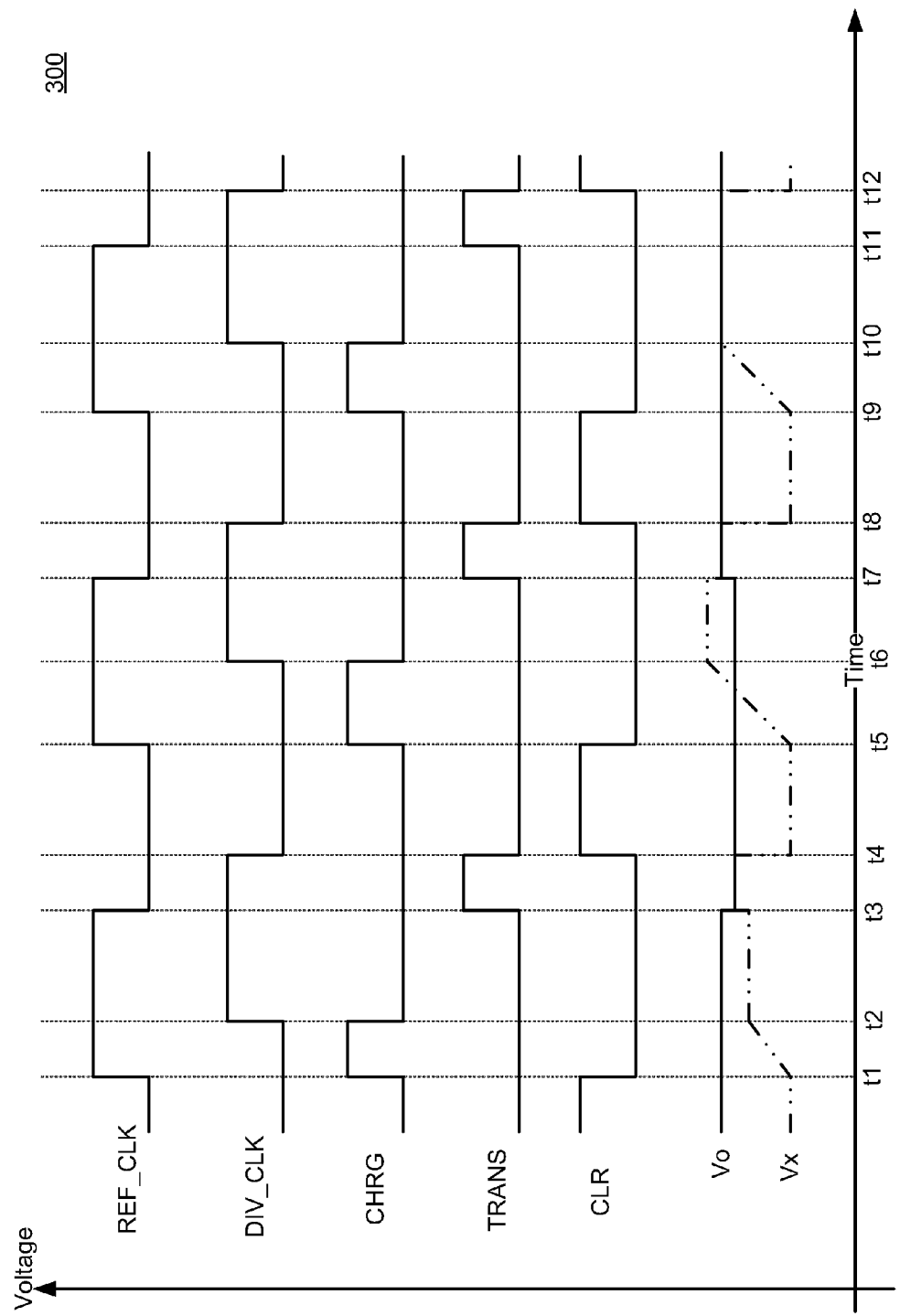
FIG. 3 is a timing diagram illustrating an operation of the charge pump and the sample-reset loop filter, according to one embodiment.

FIG. 3 is a timing diagram illustrating an operation of charge pump 210 and SHR loop filter 220, according to one embodiment. In FIG. 3, x-axis represents time and y-axis represents voltage of various signals. Time axis includes various points in time, t1 through t12, represented by vertical dotted lines. FIG. 3 shows reference clock signal 105 as REF_CLK and divider clock signal 145 as DIV_CLK. The time period between points t1 and t5 constitutes one period of REF_CLK. Time between points t1 and t5 represent a first period of REF_CLK and time between t5 and t9 represents a second period of REF_CLK. In FIG. 3, REF_CLK leads DIV_CLK as the first rising edge of REF_CLK occurs at t1 before the first rising edge of DIV_CLK occurs at t2.

SHR loop filter 220 generates voltage signals Vx and Vo only when REF_CLK leads DIV_CLK. Alternatively, SHR loop filter 220 can be implemented to generate voltage signals Vx and Vo only when REF_CLK lags DIV_CLK.

Phase detector (e.g., phase detector 110) generates signals CHRG, TRANS, and CLR based on input signals, REF_CLK and DIV_CLK. CHRG signal is used to control time at which sampling capacitor C1 is charged. CHRG is generated to represent a first time period signifying the phase difference between the rising edges of REF_CLK and DIV_CLK. For example, CHRG signal is at an active voltage level (e.g., close to supply voltage VDD) between points t1 and t2 that represents a difference in the rising edges for REF_CLK and DIV_CLK. CLR signal is used to control switch S2 to discharge a charge of sampling capacitor C1 to a low reference voltage of SHR loop filter 220. CLR signal is generated to represent a second time period when each of the signals, REF_CLK, DIV_CLK, and TRANS is at an inactive voltage level (i.e., a voltage level close to ground voltage GND). For example, CLR signal has an active voltage level between points t4 and t5 that represents a time period when each of REF_CLK, DIV_CLK, and TRANS signals is at an inactive voltage level.

TRANS signal is used to transfer a charge between sampling capacitor C1 and holding capacitor C2. TRANS is generated to represent a third time period signifying a phase difference between the falling edges of REF_CLK and DIV_CLK. For example, TRANS signal has an active voltage level between points t3 and t4 that represents a time difference in the falling edges for REF_CLK and DIV_CLK.

In some embodiments, a sum of the first time period (i.e., CHRG at an active voltage level) and the second time period (i.e., CLR at an active voltage level) is equal to one half period value of REF_CLK. For example, the sum of the first and second time periods is represented by a sum of time periods between points t1 and t2, and points t4 and t5. When REF_CLK and DIV_CLK both have a 50% duty cycle, the first time period is same as the third time period. A sum of the third time period (i.e., between points t3 and t4) and the second time period (i.e., between points t4 and t5) is represented between points t3 and t5. The time period between points t3 and t5 represents a time period when REF_CLK is at an inactive voltage level. Because REF_CLK's duty cycle is 50%, a time period for inactive voltage level is the same as the time period for active voltage level, and time period between points t3 and t5 is one half period of REF_CLK.

Alternatively or additionally, a sum of the second time period and the third time period (i.e., TRANS at active voltage level) is equal to one half period value of REF_CLK. For example, the sum of the second and third time periods is represented by time period between points t3 and t5. As discussed above with reference to the sum of the first and second time periods, the time period between points t3 and t5 is one half period of REF_CLK when REF_CLK and DIV_CLK both have a 50% duty cycle. In some embodiments, a sum of the first, second, and third time periods can be less than a period of REF_CLK. For example, the sum of the first, second, and third time periods is represented by a sum of time periods from points t1 to t2 and points t3 to t5. The period of REF_CLK is represented by a time period between points t1 and t5, which is always more than the sum of time periods from points t1 to t2 and points t3 to t5.

An operation of SHR loop filter 220 is described below. For the time period before point t1, CLR is set to an active voltage level to enable discharging of sampling capacitor, C1. Between points t1 and t2 (the first time period), switch S1 (driven by CHRG) is closed, and switches S2 (driven by CLR) and S3 (driven by TRANS) are opened. Hence, current source Ip charges sampling capacitor C1, and increases voltage level Vx. At point t2, Vx is at a voltage level that is lower than the voltage level Vo (from the previous clock cycle). The values of Vx and Vo are held constant until point t3, when TRANS signal becomes an active voltage level. Between points t3 and t4 (the third time period), switch S3 is closed, and switches S1 and S2 are opened, and a charge on sampling capacitor C1 and holding capacitor C2 is distributed amongst both capacitors C1 and C2 until the voltage levels Vx and Vo are substantially the same. That is, a charge is transferred between sampling capacitor C1 and holding capacitor C2 during the third time period until plates of capacitors C1 and C2 connected to switch S3 are substantially at the same voltage level. Because Vo is higher than Vx at point t3, Vx's voltage level increases and Vo's voltage level decreases until they both remain identical until point t4. Between points t4 and t5 (the second time period), switch S2 is closed, and switches S1 and S3 are opened, such that sampling capacitor C1 is discharged and voltage level Vx becomes an inactive voltage level (i.e., GND). Voltage level Vo remains at the same voltage level as at point t4. Time between points t1 and t5 marks the first period of REF_CLK.

Time between points t5 and t9 represent a second period of REF_CLK. During a time period between points t5 and t6, current source Ip charges sampling capacitor C1 in the same manner as the operation during the time period between points t1 and t2, as described above in detail. Because Vx's voltage level was lower than Vo's voltage level during the first period, the feedback loop of the PLL can change the VCO output to increase a phase difference between the rising edges of REF_CLK and DIV_CLK, and thereby increases a pulse width of CHRG signal, as shown in time between points t5 and t6, where a time period from points t5 to t6 is larger than a time period from points t1 to t2. Accordingly, the voltage level Vx at point t6 is larger than the voltage level Vo at point t6. Voltage levels Vx and Vo are held constant until point t7, in the same manner as the operation during a time period from points t2 to t3, as described above in detail. Between points t7 and t8, the charge on capacitors C1 and C2 is distributed amongst both capacitors C1 and C2 until the voltage levels Vx and Vo are substantially the same, in the same manner as the operation during time period from points t3 to t4, as described above in detail. That is, a charge is transferred between sampling capacitor C1 and holding capacitor C2 during the time period from points t7 to t8 until plates of capacitors C1 and C2 connected to switch S3 are substantially at the same voltage level. Because Vx is now higher than Vo at point t7, Vo's voltage level increases and Vx's voltage level decreases until they both remain identical until point t8. Between points t8 and t9, sampling capacitor C1 is discharged and voltage level Vx becomes an inactive voltage level. Voltage level Vo remains at the same voltage level as at point t4.

Time between points t9 and t12 represents a portion of a third period of REF_CLK. During a time period between points t9 and t10, current source Ip charges sampling capacitor C1 in the same manner as the operation during time period between points t1 and t2, described above in detail. Because Vx's voltage level was higher than Vo's voltage level during the second period, the feedback loop of the PLL can modify the VCO output to decrease the phase difference between the rising edges of REF_CLK and DIV_CLK, and thereby decreasing the pulse width of CHRG signal, as shown in time between points t9 and t10, where a time period from points t9 to t10 is smaller than a time period from points t5 to t6. The PLL can keep adjusting the phase difference between REF_CLK and DIV_CLK for each subsequent period of REF_CLK until the loop reaches a steady-state, where sampling capacitor C1 charges to a voltage level Vx that is substantially same as the voltage level Vo from the immediately previous period. FIG. 3 depicts the third period of REF_CLK as a period where the PLL has reached a steady-state operation. Accordingly, at point t10, the voltage level Vx is substantially the same as the voltage level Vo. Because the voltage levels Vx and Vo are substantially the same, there is no charge distribution between capacitors C1 and C2 when switch S3 is closed from points t11 to t12.

In summary, SHR loop filter 220 generates a control voltage signal that determines the VCO's oscillation frequency, which further determines the divider clock frequency (e.g., frequency of divider clock signal 145). SHR loop filter 220 generates the VCO control voltage signal based on input signals CHRG, TRANS, and CLR that control switches S1 through S3. Signals CHRG, TRANS, and CLR are generated by phase detector 110. CHRG signal drives switch S1 to charge sampling capacitor C1 during a first time period of the reference clock signal. CLR signal drives switch S2 to discharge sampling capacitor C1 to a low reference voltage during a second time period different from the first time period. CHRG and CLR signals aid in setting voltage level Vx by charging and discharging of sampling capacitor C1. TRANS signal drives switch S3 to distribute of a charge amongst sampling capacitor C1 and holding capacitor C2 during a third time period until both capacitors C1 and C2 have substantially the same voltage level across the capacitors. A voltage level across holding capacitor C2 is voltage Vo that is input as VCO control voltage (e.g., control voltage signal 125). While PLLs are designed to phase lock at an intended fundamental frequency, PLLs can also phase lock to a sub-harmonic frequency as described in FIG. 4 below.

Figure 4:
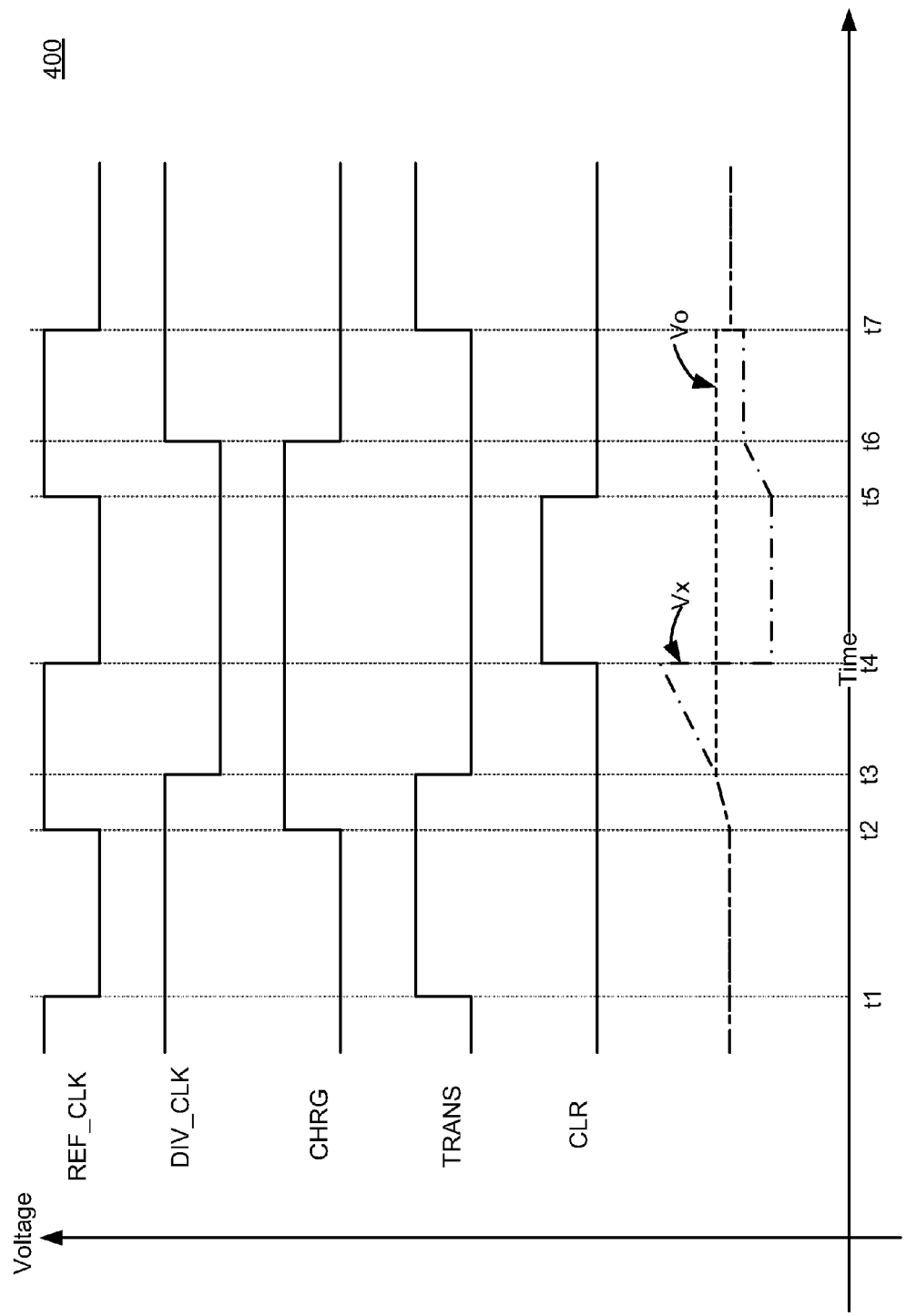
FIG. 4 is a timing diagram illustrating a sub-harmonic locking of a PLL, according to one embodiment.

FIG. 4 is a timing diagram illustrating a sub-harmonic locking of a PLL, according to one embodiment. Sub-harmonic locking occurs when phase locking occurs between the divider clock signal and the reference clock signal at a frequency of the divider clock signal that corresponds to a sub-harmonic of an intended frequency of the VCO output signal. For example, when an intended oscillation frequency that is the fundamental frequency of the oscillator output signal is 2 GHz, a divide-by-10 frequency divider can divide the 2 GHz VCO signal down to 200 MHz. In a normal mode of operation, the PLL phase locks between a 200 MHz reference clock signal and the 200 MHz divider clock signal. If, however, the VCO oscillates at a sub-harmonic of the intended 2 GHz (i.e., at 1 GHz resulting in a 100 MHz divider clock frequency), the PLL can phase lock between the 200 MHz reference clock signal and the 100 MHz divider clock signal. In FIG. 4, x-axis represents time and y-axis represents voltage for various signals. Time axis includes various points in time, points t1 through t7, represented by vertical dotted lines. FIG. 4 shows reference clock signal 105 as REF_CLK and divider clock signal 145 as DIV_CLK.

As shown in FIG. 4, the frequency of DIV_CLK is roughly half of the frequency of REF_CLK. That is, a period of DIV_CLK is roughly twice that of REF_CLK. The first rising edge of REF_CLK, as depicted at point t2, triggers the phase detector to generate CHRG signal with an active voltage level (e.g., close to VDD). The first rising edge of DIV_CLK, as depicted at point t6, triggers the phase detector to generate CHRG signal with an inactive voltage level (e.g., close to GND). The first falling edge of REF_CLK, as depicted at point t1, triggers the phase detector to generate TRANS signal with an active voltage level (e.g., close to VDD). The first falling edge of DIV_CLK, as depicted at point t3, triggers the phase detector to generate TRANS signal with an inactive voltage level.

As discussed above with reference to FIGS. 2 and 3, CLR signal is generated to represent a second time period when each of the signals, REF_CLK, DIV_CLK, and TRANS is at an inactive voltage level. Because the period of DIV_CLK is twice that of REF_CLK, REF_CLK toggles while DIV_CLK remains at an inactive voltage level and while CHRG signal is at an active voltage level. For example, for a time period between points t4 and t5, when each of the signals, REF_CLK, DIV_CLK, and TRANS is at an inactive voltage level, phase detector generates CLR signal with an active voltage level, during a time period where CHRG signal is still at an active voltage level. This causes the problem of sub-harmonic locking as described below.

As shown in FIG. 4, both CHRG and TRANS signals are at an active voltage level which results in current source Ip charging both sampling capacitor C1 and holding capacitor C2 higher to a same voltage level during time period from points t2 to t3. Between points t3 and t4, when TRANS becomes inactive while CHRG remains at an active voltage level, sampling capacitor C1 keeps charging to increase the voltage level Vx while holding capacitor C2 holds its charge to keep voltage level Vo same as at point t3. During time between points t4 and t5, CLR signal becomes active (i.e., CLR signal is pulled to an active voltage level) because each of the signals, REF_CLK, DIV_CLK, and TRANS are at an inactive voltage level. During the time period between points t4 and t5, CLR signal becomes active while CHRG signal also becomes active. That is, while CHRG signal is at an active voltage level keeping switch S1 closed to keep charging sampling capacitor C1, CLR signal closes switch S2 to discharge sampling capacitor C1. Accordingly, Vx becomes inactive at point t4 and remains inactive as long as CLR is at an active level, which is until point t5. Between points t5 and t6, CLR signal becomes inactive while CHRG remains at an active voltage level, and sampling capacitor C1 is charged to a voltage level that is lower than the existing voltage level Vo. At point t7, CHRG signal goes low and TRANS signal goes high, and the charge on sampling capacitor C1 and holding capacitor C2 is distributed until Vx and Vo reach substantially the same voltage level. The process described above between points t1 and t7 is repeated until voltage level Vo reaches a steady-state value that corresponds to a sub-harmonic locking of the PLL.

Because CLR signal becomes active to discharge sampling capacitor C1 while sampling capacitor C1 is being charged by placing CHRG signal active, sampling capacitor C1 cannot be charged for the whole duration for which CHRG is at an active voltage level. Accordingly, if the VCO generates an oscillator output signal such that the divider clock signal is at a sub-harmonic frequency of the reference clock signal, the PLL using a conventional phase detector would result in a sub-harmonic locking. An embodiment of phase frequency detector (PFD) addressing the issue of sub-harmonic locking is described below in detail with reference to FIGS. 5A and 5B.

Figure 5A:
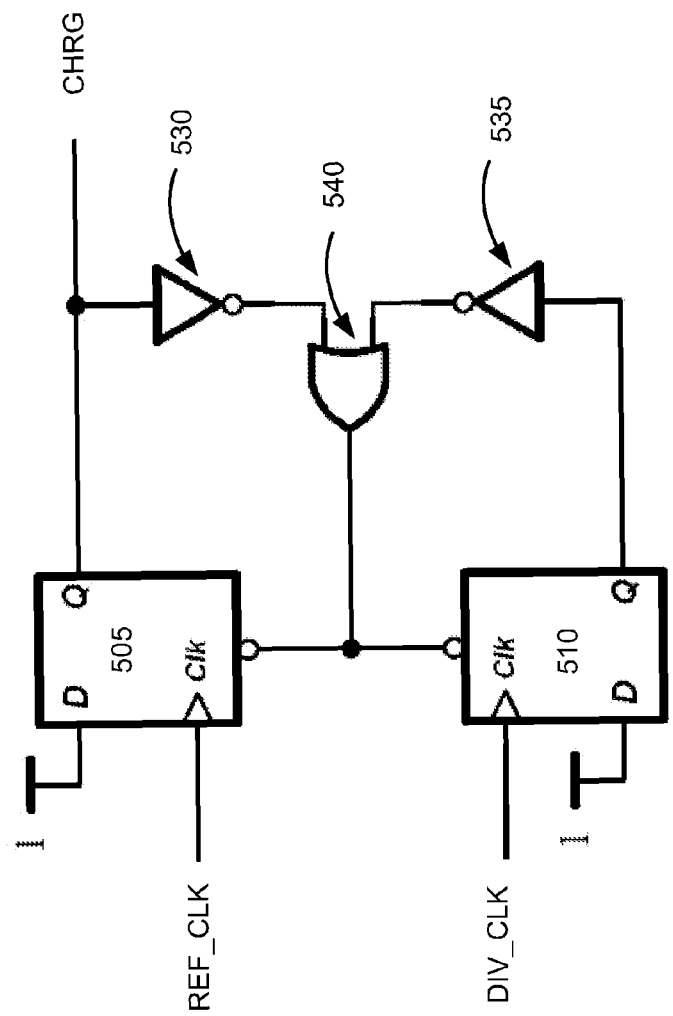
FIG. 5A is a block diagram illustrating a first portion of a phase/frequency detector (PFD) of a type-I PLL, according to one embodiment.
Figure 5B:
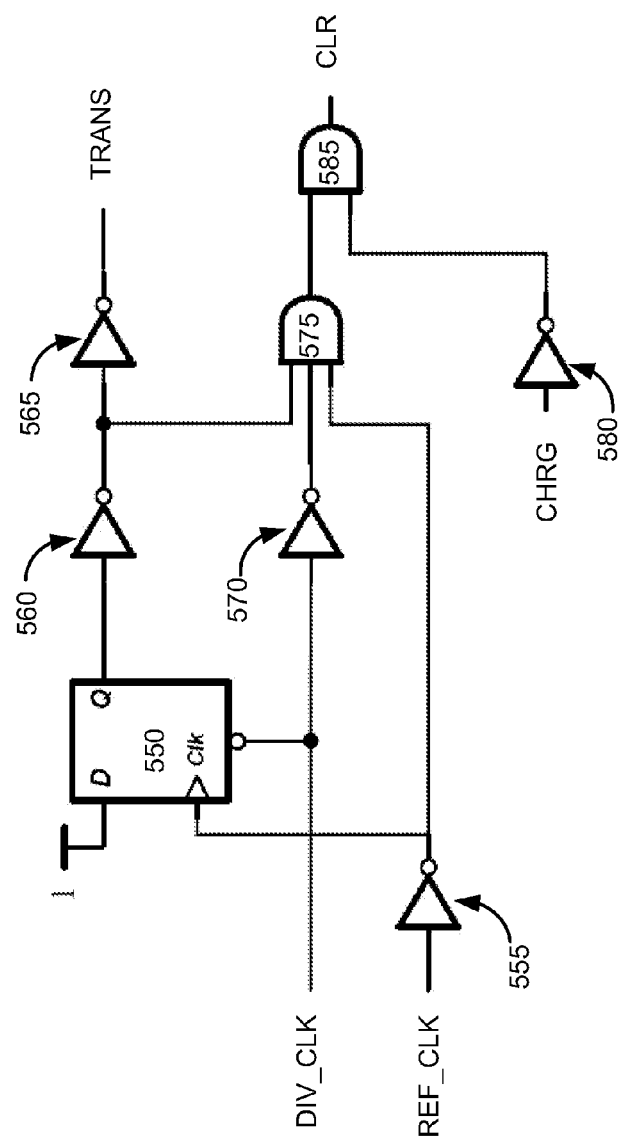
FIG. 5B is a block diagram illustrating a second portion of the PFD, according to one embodiment.

FIGS. 5A and 5B show block diagrams illustrating a PFD of a type-I PLL that can prevent the problem of sub-harmonic locking, according to one embodiment. The PFD can place a gating element to generate a CLR signal that helps in preventing a discharging of sampling capacitor C1 during a time period when sampling capacitor C1 is still being charged. FIG. 5A shows a first portion of the PFD that can generate CHRG signal, and FIG. 5B shows a second portion of the PFD that can generate TRANS and CLR signals. The first portion of the PFD includes, among other components, two D flip-Flops 505 and 510, two inverters 530 and 535, and an OR gate 540.

Flip-flop 505 receives REF_CLK as the clock input and its D-input is tied to its supply voltage (i.e., VDD to set a logical high value or an active level). Flip-flop 510 receives DIV_CLK as the clock input and its D-input is also tied to its supply voltage. At a rising edge of the REF_CLK, flip-flop 505 outputs (CHRG signal) an active level signal and remains at the active level until flip-flop 505 is reset. At the first rising edge of DIV_CLK after the rising edge of flip-flop 505, the output of flip-flop 515 becomes an active level signal. When the output signals of both flip-flops 505 and 515 are set to an active level, the output of OR gate 540 is set to an inactive level (i.e., GND), and both the flip-flops, 505 and 515, are reset to change the CHRG signal value to an inactive voltage level. Because an output of only one flip-flop is used in the PLL, this PFD is a unipolar PFD.

The second portion of the PFD as illustrated in FIG. 5B includes D flip-flop 550, two AND gates 575 and 585, and five inverters 555, 560, 565, 570, and 580. Flip-flop 550 receives REF_CLK as the clock input and its D-input is tied to its supply voltage. At a falling edge of the REF_CLK, flip-flop 550 outputs an active level signal and remains at the active level until flip-flop 550 is reset. Flip-flop 550's output Q is passed through inverters 560 and 565, and the output of inverter 565 is TRANS signal. Accordingly, TRANS signal reaches an active level when (after propagation delay of inverters 560 and 565) flip-flop 550's Q output reaches an active level. TRANS signal remains at an active level until flip-flop 550 is reset. When DIV_CLK reaches an inactive value (at the first falling edge of DIV_CLK after the falling edge of REF_CLK), flip-flop 550 is reset to set its Q output as an inactive level. TRANS signal will follow the Q output to an inactive level after the propagation delay of inverters 560 and 565.

Gating element 585 shown in FIG. 5B generates CLR signal that controls switch S2 to discharge sampling capacitor C1 to a low reference voltage (e.g., ground of the SHR loop filter). In one embodiment, gating element 585 is a digital gate performing a logical AND operation. For example, gating element 585 can be a 2-input AND gate shown in FIG. 5B. 2-input AND gate 585 receives an inverted version of CHRG signal as the first input and the output of AND gate 575 as the second input to generate CLR signal. AND gate 585's first input is an output of inverter 580 that receives CHRG signal as its input. AND gate 575 is a 3-input AND gate that receives an inverted version of signals, TRANS, DIV_CLK, and REF_CLK. 2-input AND gate 585 and 3-input AND gate 575 can be combined logically to effectively result in a 4-input AND gate (not shown). The four inputs of the 4-input AND gate are inverted versions of signals, TRANS, REF_CLK, DIV_CLK, and CHRG. That is, CLR signal reaches an active voltage level (i.e., close to VDD) only when all of the signals, TRANS, REF_CLK, DIV_CLK, and CHRG are at an inactive voltage level (i.e., close to GND). In other words, the PFD generates CLR signal to control switch S2 to discharge sampling capacitor C1 such that sampling capacitor C1 is discharged only when sampling capacitor C1 is not being charged, and also only when there is no charge distribution between sampling capacitor C1 and holding capacitor C2. This prevents the discharging of sampling capacitor C1 while it is still being charged during a time period between points t4 and t5 of FIG. 4.

By preventing discharging of sampling capacitor C1 when it is being charged, the PLL can avoid the sub-harmonic locking problem. Referring back to FIG. 4, when using the PFD depicted in FIGS. 5A and 5B, sampling capacitor C1 will not discharge and accordingly Vx will not switch to an inactive level at point t4. Instead, sampling capacitor C1 will keep charging for as long as CHRG signal remains at an active level (i.e., until point t6) and voltage level Vx will also keep increasing. Later at point t7, when TRANS signal reaches an active level, a charge distribution occurs between sampling capacitor C1 and holding capacitor C2, and the voltage level Vo increases until Vx and Vo are at substantially the same voltage level. After some number of REF_CLK periods, voltage level Vo increases to a sufficient level to lock the divider clock signal to a fundamental frequency (instead of a sub-harmonic frequency) of the reference clock. In this way, the problem of sub-harmonic locking can be prevented.

Even though FIG. 5B shows feeding the output of inverter 560 as input to AND gate 575 (and not an actual inverted version of signal TRANS), an inverted version of TRANS and the output of inverter 560 are logically the same signals.

Figure 6:
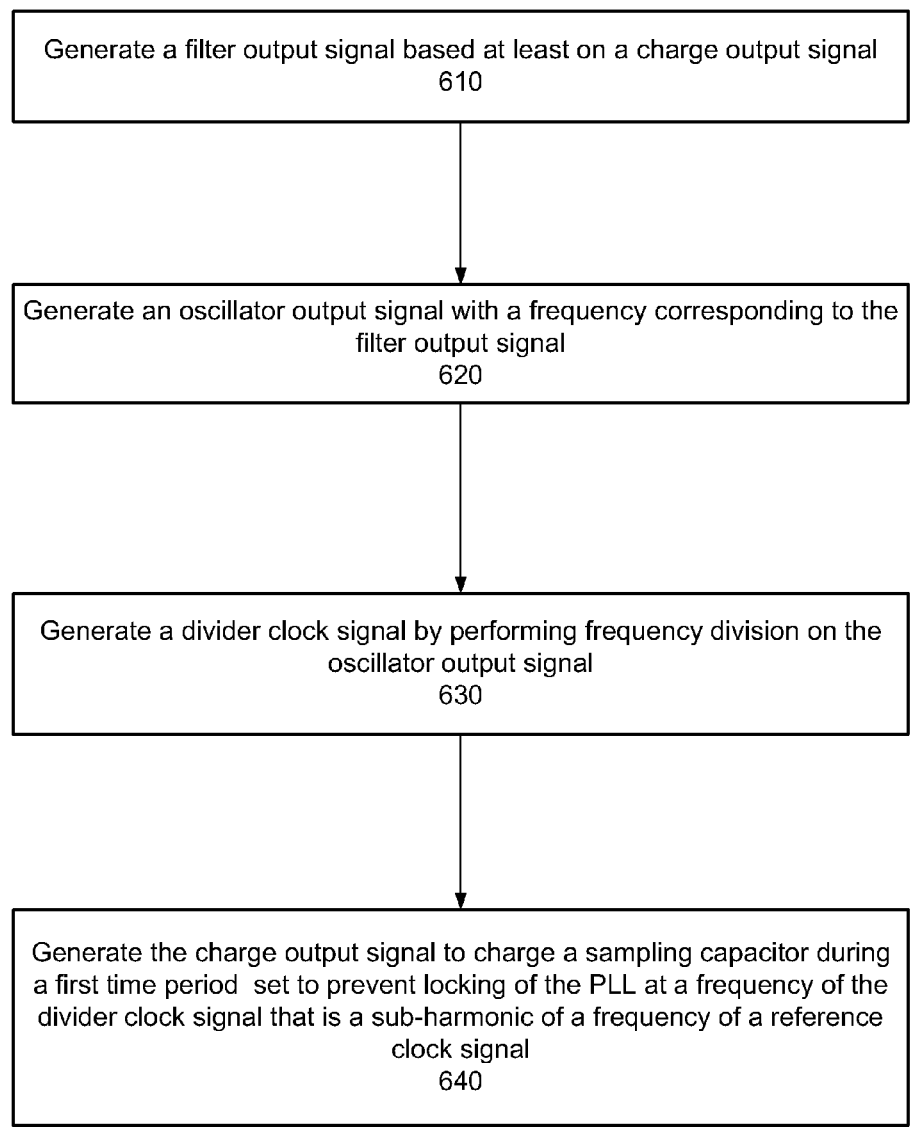
FIG. 6 is a flowchart illustrating a process of operating a type-I PLL, according to one embodiment.

FIG. 6 is a flowchart depicting an operation of a type-I PLL, according to one embodiment. First, an SHR loop filter can generate 610 a filter output signal based on at least a charge output signal (e.g., CHRG signal) controlling the time at which a sampling capacitor of the loop filter is charged. For example, SHR loop filter generates Vo output signal based at least on CHRG signal as described above with reference to FIGS. 2 and 3. In one embodiment, the filter output signal can be generated based on other signals such as a transfer output signal (e.g., TRANS signal) that controls a switch to transfer a charge between the sampling capacitor and a holding capacitor. Alternatively, the filter output signal can be generated based on other signals such as a clear output signal (e.g., CLR signal) that causes the sampling capacitor to discharge charge stored in the sampling capacitor to a low reference voltage of the loop filter. A relationship between the TRANS and CLR signals, and filter output signal Vo is also described above with reference to FIGS. 2 and 3.

A VCO of the PLL can generate 620 an oscillator output signal with a frequency corresponding to the filter output signal. A frequency divider can generate 630 a divider clock signal by performing a frequency division on the oscillator output signal, the divider clock signal having a same phase as the oscillator output signal but a frequency different than the oscillator output signal. For example, if the frequency divider divides by an integer 4 and if the VCO produces an oscillator output signal at 4 GHz, the frequency divider will divide the 4 GHz into a divider clock signal at 1 GHz but with the same phase as that of the 4 GHz oscillator output signal.

A PFD can generate 640 the charge output signal (i.e., CHRG signal) to control a switch to charge the sampling capacitor during a first time period set to prevent locking of the PLL at a frequency corresponding to a sub-harmonic frequency of an intended VCO output signal. For example, the first time period is from points t1 to t2 of FIG. 3. The first time period can be defined by a pulse width of CHRG signal such that the pulse width of the charge output signal increases as a phase difference between the reference clock signal and the divider clock signal increases, and the pulse width of the charge output signal decreases as the phase difference decreases. The PFD can also generate a clear output signal (e.g., CLR signal) that causes the sampling capacitor to discharge a charge of the sampling capacitor to a low reference voltage of the loop filter during a second time period, the second time period is a time period different from the first time period. For example, the second time period is from points t4 to t5 of FIG. 3.

The PFD can further generate a transfer output signal (e.g., TRANS signal) that causes a transfer a charge between the sampling capacitor and the holding capacitor during a third time period, the third time period is a time period different from the second time period. For example, the third time period is from points t3 to t4 of FIG. 3. The third time period can be defined by a pulse width of the transfer output signal such that the pulse width of the transfer output signal increases as the phase difference between the reference clock signal and the divider clock signal increases, and the pulse width of the transfer signal decreases as the phase difference decreases.

To prevent locking of the PLL at a frequency of the divider clock signal that corresponds to a sub-harmonic of a frequency of the oscillator output signal, the CLR signal is generated to be at an active level during the second time period during which a charge is not transferred between the sampling capacitor and the holding capacitor, and also during which each of the divider clock signal and the reference clock signal is at an inactive voltage level.

In one embodiment, a sum of the first time period and the second time period is equal to one half period value of the reference clock signal (i.e., REF_CLK). Alternatively or additionally, a sum of the second time period and the third time period is equal to one half period value of REF_CLK. Alternatively or additionally, a sum of the first, second, and third time periods can be less than a period of REF_CLK. A relationship between the first, second, and third time periods are described above with reference to FIG. 2.

Figure 7:
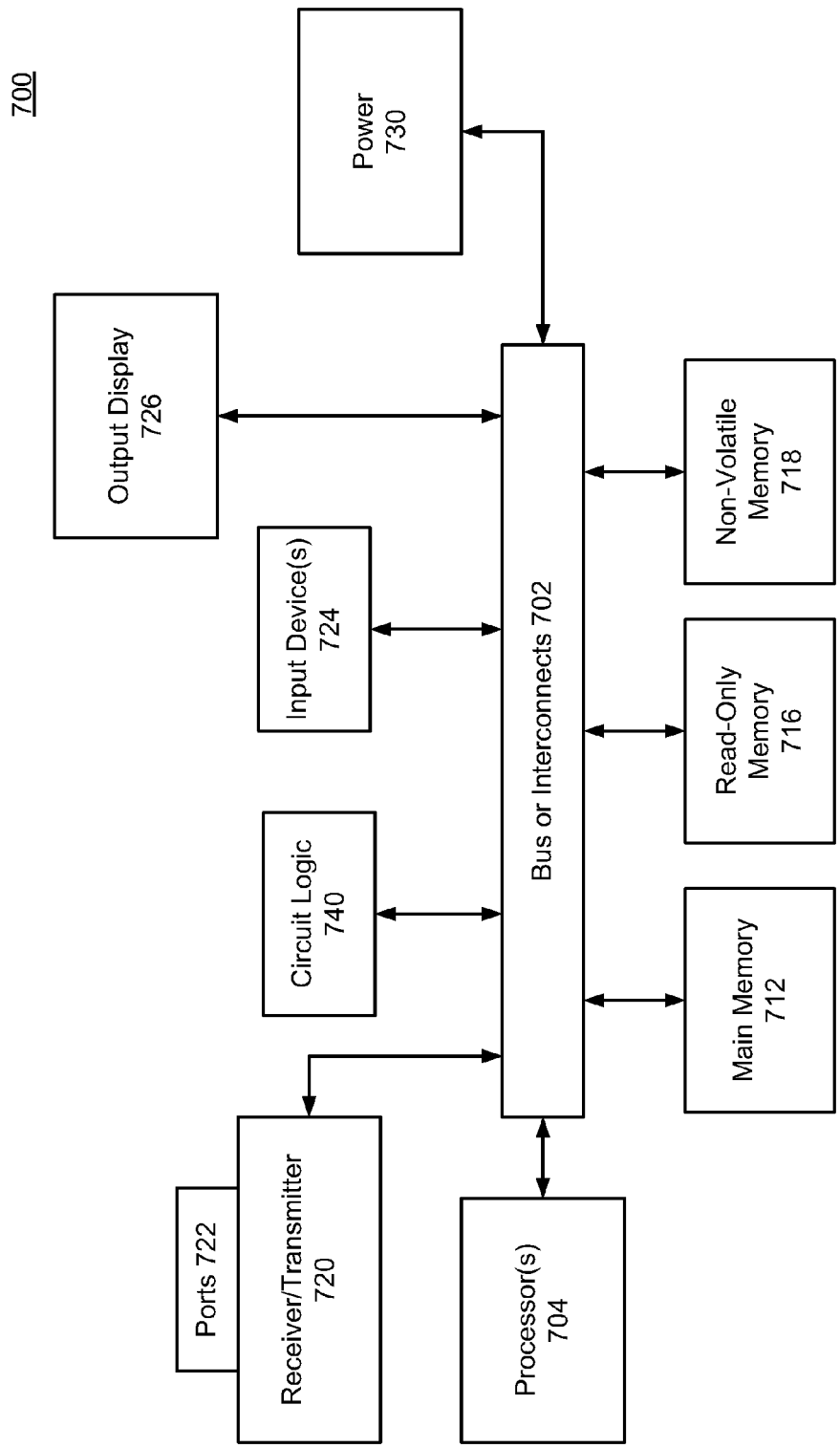
FIG. 7 is a block diagram illustrating an electronic device that stores a representation of a type-I PLL, according to one embodiment.

FIG. 7 is a block diagram of a special-purpose computing device that can store a representation of a PLL, according to one embodiment. In one embodiment, a representation of a type-I PLL or components within the PLL can be stored as data at in a non-transitory computer-readable medium (e.g., non-volatile memory 718). The representation can be at a behavioral level, register transfer level, logic component level, transistor level, and layout geometry-level of the PLL.

In some embodiments, computer 700 comprises an interconnect or bus 702 (or other communication means) for transmission of data. Computer 700 can include a processing means such as one or more processors 704 coupled with bus 702 for processing information. Processors 704 can comprise one or more physical processors and/or one or more logical processors. While bus 702 is illustrated as a single interconnect for simplicity, it is understood that bus 702 can represent multiple different interconnects or buses. Bus 702 shown in FIG. 7 is an abstraction that represents any one or more separate physical buses, point to point connections, or both connected by appropriate bridges, adapters, controllers and/or the like.

In some embodiments, computer 700 further comprises a random access memory (RAM) or other dynamic storage device depicted as main memory 712 for storing information and instructions to be executed by processors 704. Main memory 712 can include an active storage of applications including a browser application for using in network browsing activities by a user of computer 700. Main memory 712 can further include certain registers or other special purpose memory.

Computer 700 can also comprise a read only memory (ROM) 716 or other static storage device for storing static information and instructions for processors 704. Computer 700 can further include one or more non-volatile memory elements 718 for the storage of certain elements, including, for example, flash memory, a hard disk, solid-state drive. Non-volatile memory elements 718 can store a representation of a type-I PLL described above with references to FIGS. 2 through 5, or components within the PLL, can be stored as data. The representation can be at a behavioral level, register transfer level, logic component level, transistor level, and layout geometry-level of the PLL.

Computer 700 can comprise transceiver module 720 that is coupled to bus 702. Transceiver module 720 can further comprise a transmitter module and a receiver module. Transceiver module 720 comprises one or more ports 722 to connect to other devices (not shown).

Computer 700 can also comprise circuit logic 740 coupled to bus 702 and configured to detect information from a second device (not shown) coupled through ports 722. Computer 700 can also comprise output display 726 and coupled via bus 702. In some embodiments, display 726 can include a liquid crystal display (LCD) or any other display technology, for displaying information or content to a user, including three-dimensional (3D) displays. Alternatively, display 726 can include a touch screen that can also be part of input device 724. In some environments, display 726 can include an audio device, such as a speaker for providing audio information. Computer 700 can also comprise power device 730 that can comprise a power supply, a battery, a solar cell, a fuel cell, or other device for providing or generating power. Any power provided by power device 730 can be distributed as required to elements of computer 700.

While particular embodiments and applications of the present disclosure have been illustrated and described, it is to be understood that the embodiments are not limited to the precise construction and components disclosed herein and that various modifications, changes and variations may be made in the arrangement, operation and details of the method and apparatus of the present disclosure disclosed herein without departing from the spirit and scope of the disclosure as defined in the appended claims.

What is claimed is:

1. A phase-locked loop (PLL) comprising:
a loop filter comprising a sampling capacitor and a holding capacitor coupled in parallel via a switching element, the loop filter configured to generate a filter output signal based at least on a charge output signal indicating a first time period during which the sampling capacitor is charged;
a voltage controlled oscillator (VCO) coupled to the loop filter and configured to generate an oscillator output signal with a frequency corresponding to the filter output signal;
a divider coupled to the VCO to receive the oscillator output signal, the divider configured to perform frequency division on the oscillator output signal to generate a divider clock signal having a same phase as the oscillator output signal but a frequency different than the oscillator output signal; and
a phase frequency detector coupled to the divider to receive the divider clock signal, the phase frequency detector configured to generate the charge output signal based on a phase difference between the divider clock signal and a reference clock signal, the phase frequency detector further configured to prevent locking of the PLL at a sub-harmonic of a frequency of the oscillator output signal, the phase frequency detector comprising a gating element configured to generate a clear output signal causing the sampling capacitor to discharge charge stored in the sampling capacitor to a low reference voltage of the loop filter during a second time period defined as a period during which a charge is not transferred between the sampling capacitor and the holding capacitor via the switching element, and during which the divider clock signal and the reference clock signal are inactive.

2. The PLL of claim 1, wherein the gating element is a digital gate performing a logical AND operation.

3. The PLL of claim 1, wherein a sum of the first time period and the second time period is equal to one half period of the reference clock signal.

4. The PLL of claim 1, wherein the phase frequency detector is further configured to generate a transfer output signal causing a transfer of charge between the sampling capacitor and the holding capacitor during a third time period different from the second time period.

5. The PLL of claim 4, wherein the third time period is defined by a pulse width of the transfer output signal, the pulse width of the transfer output signal increases as the phase difference increases and the pulse width of the transfer signal decreases as the phase difference decreases.

6. The PLL of claim 4, wherein a sum of the first time period, the second time period, and the third time period is less than a period of the reference clock signal.

7. The PLL of claim 4, wherein a sum of the second time period and the third time period is equal to one half period of the reference clock signal.

8. The PLL of claim 1, wherein the first time period is defined by a pulse width of the charge output signal, the pulse width of the charge output signal increases as the phase difference increases and the pulse width of the charge signal decreases as the phase difference decreases.

9. A method for operating a phase-locked loop (PLL), comprising:
generating, by a loop filter, a filter output signal based at least on a charge output signal;
generating, by a voltage controlled oscillator, an oscillator output signal with a frequency corresponding to the filter output signal;
generating, by a divider, a divider clock signal by performing a frequency division on the oscillator output signal, the divider clock signal having a same phase as the oscillator output signal but a frequency different than the oscillator output signal;
generating, by a phase frequency detector, the charge output signal to charge a sampling capacitor during a first time period set to prevent locking of the PLL at a frequency that is a sub-harmonic of a frequency of the oscillator output signal; and
generating, by the phase frequency detector, a clear output signal causing the sampling capacitor to discharge a charge stored in the sampling capacitor to a low reference voltage of the loop filter during a second time period defined as a period during which a charge is not transferred between the sampling capacitor and the holding capacitor, and during which each of the divider clock signal and the reference clock signal is inactive.

10. The method of claim 9, wherein a sum of the first time period and the second time period is equal to one half period of the reference clock signal.

11. The method of claim 9, further comprising:
generating, by the phase frequency detector, a transfer output signal to transfer a charge between the sampling capacitor and the holding capacitor during a third time period different from the second time period.

12. The method of claim 11, wherein the third time period is defined by a pulse width of the transfer output signal, the pulse width of the transfer output signal increasing as a phase difference between the reference clock signal and the divider clock signal increases, and the pulse width of the transfer signal decreasing as the phase difference decreases.

13. The method of claim 11, wherein a sum of the first time period, the second time period, and the third time period is less than a period of the reference clock signal.

14. The method of claim 11, wherein a sum of the second time period and the third time period is equal to one half period of the reference clock signal.

15. The method of claim 9, wherein the first time period is defined by a pulse width of the charge output signal, the pulse width of the charge output signal increases as the phase difference between the reference clock signal and the divider clock signal increases, and the pulse width of the charge output signal decreases as the phase difference decreases.

16. A non-transitory computer-readable medium storing a representation of a phase-locked loop (PLL), the PLL comprising:
a loop filter comprising a sampling capacitor and a holding capacitor coupled in parallel via a switching element, the loop filter configured to generate a filter output signal based at least on a charge output signal indicating a first time period during which the sampling capacitor is charged;
a voltage controlled oscillator (VCO) coupled to the loop filter and configured to generate an oscillator output signal with a frequency corresponding to the filter output signal;
a divider coupled to the VCO to receive the oscillator output signal, the divider configured to perform frequency division on the oscillator output signal to generate a divider clock signal having a same phase as the oscillator output signal but a frequency different than the oscillator output signal; and
a phase frequency detector coupled to the divider to receive the divider clock signal, the phase frequency detector configured to generate the charge output signal based on a phase difference between the divider clock signal and a reference clock signal, the phase frequency detector further configured to prevent locking of the PLL at a sub-harmonic of a frequency of the oscillator output signal, the phase frequency detector comprising a gating element configured to generate a clear output signal causing the sampling capacitor to discharge charge stored in the sampling capacitor to a low reference voltage of the loop filter during a second time period defined as a period during which a charge is not transferred between the sampling capacitor and the holding capacitor via the switching element, and during which the divider clock signal and the reference clock signal are inactive.

* * * * *